United States Patent [19]

Hayashi et al.

[11] Patent Number: 4,631,802

[45] Date of Patent: Dec. 30, 1986

[54] PROCESS FOR THE PRODUCTION OF A SEMICONDUCTOR DEVICE

[75] Inventors: Hideki Hayashi; Kenichi Kikuchi, both of Osaka, Japan

[73] Assignee: Sumitomo Electric Industries, Ltd., Osaka, Japan

[21] Appl. No.: 715,814

[22] Filed: Mar. 25, 1985

Related U.S. Application Data

[60] Division of Ser. No. 640,229, Aug. 13, 1984, Pat. No. 4,321,888, which is a continuation of Ser. No. 275,029, Jun. 18, 1981, abandoned.

[30] Foreign Application Priority Data

Jun. 24, 1980 [JP] Japan ................................. 55-85523

[51] Int. Cl.[4] ............................................. H01L 21/36
[52] U.S. Cl. ................................ 29/576 E; 29/569 L; 148/175; 372/45; 372/48
[58] Field of Search ........................ 29/569 L, 576 E; 372/45, 48, 50; 357/17; 148/175

[56] References Cited

U.S. PATENT DOCUMENTS

| 3,892,608 | 7/1975 | Kuhn ................... | 148/188 |
|---|---|---|---|
| 4,099,999 | 7/1978 | Burnham et al. ............ | 148/187 |
| 4,466,173 | 8/1984 | Baliga ..................... | 29/571 |
| 4,507,849 | 4/1985 | Shinozaki .................. | 29/576 W |
| 4,509,996 | 4/1985 | Greene et al. ............... | 148/171 |
| 4,521,888 | 6/1985 | Hayashi et al. ............. | 372/50 |
| 4,542,512 | 9/1985 | Van Den Beemt ............. | 322/46 |

FOREIGN PATENT DOCUMENTS

| 55-166985 | 12/1980 | Japan ................... | 29/569 L |
|---|---|---|---|
| 57-153487 | 9/1982 | Japan ................... | 29/569 L |
| 59-88889 | 5/1984 | Japan ................... | 29/569 L |
| 2079048 | 1/1982 | United Kingdom ........... | 29/576 E |

OTHER PUBLICATIONS

Mori et al., "V-DH Laser: V-Shaped", Electronics Letters, 25th Sep. 1980, vol. 16, No. 20, pp. 785-787.

Primary Examiner—Brian E. Hearn
Assistant Examiner—Tuan Quach
Attorney, Agent, or Firm—Wenderoth, Lind & Ponack

[57] ABSTRACT

A semiconductor device composed of a transistor for modulation and a semiconductor laser as one body, in which on the uppermost layer of a semiconductor laser composed of a multilayer epitaxial wafer, there is provided a layer consisting of a semiconductor of different conductivity type from that of the uppermost layer and having a V-shaped groove filled with a semiconductor zone of the same conductivity type as that of the uppermost layer, and ohmic electrodes are provided on the back surface of the substrate of the semiconductor laser, the semiconductor layer of different conductivity type and the semiconductor zone of the same conductivity type.

1 Claim, 6 Drawing Figures

PROCESS FOR THE PRODUCTION OF A SEMICONDUCTOR DEVICE

This application is a division of Ser. No. 640,229 filed Aug. 13, 1984, now U.S. Pat. No. 4,321,888, which is a continuation of Ser. No. 275,029 filed June 18, 1981, now abandoned.

BACKGROUND OF THE INVENTION

1. Field of the Invention

This invention relates to a semiconductor device composed of a transistor for modulation and a semiconductor laser as one body and a process for the production of the same.

2. Description of the Prior Art

Semiconductor optical circuit elements, for example, light-emitting devices such as light-emitting diodes and semiconductor lasers, optical modulation elements, and light-detecting devices such as avalanche photodiodes and the like, and semiconductor electronic circuit elements, for example, transistors, diodes and the like, should have different epitaxial structures. When these two kinds of circuit elements can be formed on the same substrate, it is possible to realize miniaturization of the device, improved high frequency characteristics and reliability and lower production cost. Thus, a useful technique has strongly been desired for the purpose of forming these two kinds of circuit elements on the same substrate.

Various reports have hitherto been made on a method of forming a semiconductor laser and transistor for the modulation of this laser on the same substrate. In these methods, an epitaxial wafer having both an epitaxial multilayer for a laser and an epitaxial layer for a field-effect transistor is used. That is, in the wafer surface, there is formed the epitaxial layer in a zone for the field-effect transistor and the epitaxial multilayer in a zone for the laser by partially etching the wafer surface or by the use of diffusion, and these elements are connected by a semiconductor layer or metal. However, a very complicated process is required for the fabrication of these elements, and not much electric current can flow because of the use of a field-effect transistor of Shottky-barrier gate type using an n-type semiconductor layer on a semi-insulating substrate as an active layer. As to semiconductor lasers, various stripe structures to obtain a fundamental mode in the lateral direction have been reported, but each of these structures is too complicated.

SUMMARY OF THE INVENTION

It is an object of the present invention to provide a semiconductor device composed of a transistor for modulation and a semiconductor laser as one body.

It is another object of the present invention to provide a process for making this semiconductor.

It is a further object of the present invention to provide a semiconductor device whereby a large current can flow and a high speed operation is possible.

These objects can be attained by a semiconductor device, in which on the uppermost layer of a semiconductor laser composed of a multilayer epitaxial wafer, there is provided a layer consisting of a semiconductor of different conductive type from that of the uppermost layer and having a V-shaped groove filled with a semiconductor zone of the same conductivity type as that of the uppermost layer, and ohmic electrodes are provided on the back surface of the semiconductor layer substrate, the semiconductor layer of different conductivity type and the semiconductor zone of the same conductivity type. The process for making this semiconductor device, comprises a step of growing epitaxially on the uppermost layer of a semiconductor laser composed of a multilayer epitaxial wafer a layer consisting of a semiconductor of different conductivity type from that of the uppermost layer, a step of etching only the semiconductor layer with an anisotropic and selective etchant to give a V-shaped cross section a step of growing epitaxially another layer consisting of a semiconductor of different conductivity from that of the semiconductor layer to form a flat surface, a step of etching the whole surface until the semiconductor layer is exposed except on the area of the V-shaped zone, and a step of forming ohmic electrodes on the semiconductor zone of V-shape, the semiconductor layers positioned opposite each other across the semiconductor zone of V-shape and the back surface of a substrate.

BRIEF DESCRIPTION OF THE DRAWINGS

The accompanying drawings illustrate the principle and merits of the present invention in more detail.

DETAILED DESCRIPTION OF THE INVENTION

The present invention provides a semiconductor device comprising a multilayer epitaxial wafer for constituting a semiconductor laser, a semiconductor layer provided on the uppermost layer of the wafer, consisting of a semiconductor of different conductivity from that of the uppermost layer and having a V-shaped groove in which there is provided a semiconductor zone of the same conductivity as that of the uppermost layer, and ohmic electrodes on the back surface of the substrate of the semiconductor laser, the semiconductor layer of different conductivity type and the semiconductor zone of the same conductivity type.

That is, the present invention provides, in a semiconductor device integrating a semiconductor laser and a transistor for modulating the laser, comprising semiconductor layers on a substrate and ohmic electrodes on the back surface of the substrate and on the uppermost semiconductor layer, the improvement wherein the semiconductor layers except the uppermost layer are semiconductor layers whose cavity is constructed by a pair of etched surfaces perpendicular to the semiconductor layers, the uppermost semiconductor layer is portioned into three semiconductor sections by a V-shaped boundary extending through the entire thickness of the uppermost semiconductor layer perpendicular to the etched surfaces, the three semiconductor sections being a first semiconductor section within the V-shaped boundary and being of the same conductivity type as that of the semiconductor layer lying below said first semiconductor section, and second and third semiconductor sections separated by the first section and having a different conductivity type from that of the first semiconductor section, and the ohmic electrodes on the uppermost semiconductor layer are on each of the first, second and third semiconductor sections of the uppermost semiconductor layer.

Figure 1:
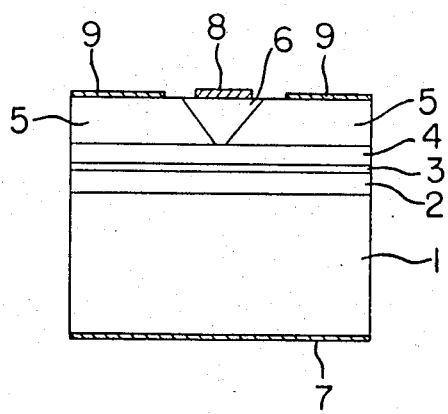
FIG. 1 is a cross sectional view of a semiconductor device according to the present invention, and FIGS. 2 (a), (b), (c), (d) and (e) are cross sectional views which illustrate in order the steps of making a semiconductor device according to the present invention.

The device of the present invention is, for example, as shown in FIG. 1. This can be prepared by a simple process because of forming a semiconductor laser and transistor above and below in the same region of a wafer, and further makes possible a high speed operation as well as large electric current flow as compared with a Shottky-barrier gate field effect transistor (FET), because of the use of a vertical-type static induction transistor (SIT). Referring to FIG. 1, a semiconductor device is composed of semiconductor substrate 1, active layer 3 of a laser, cladding layers 2 and 4, semiconductor layer 5 of different conductivity type from that of 4, semiconductor zone 6 of the same conductivity as that of 4, and ohmic electrodes 7, 8 and 9. In the operation of this device, the voltage applied to electrodes 9 is changed to change the width of depletion layers between semiconductor zones 5 and 6, and 5 and 4 and to change the driving current of the laser flowing through electrodes 7 and 8.

In the present invention, a semiconductor device is produced by growing epitaxially, on the uppermost layer of a semiconductor laser composed of a multilayer epitaxial wafer, a layer consisting of a first semiconductor of different conductivity type from that of the uppermost layer, etching the first semiconductor layer only with an anisotropic and selective etchant to give a cross section of V-shape, growing epitaxially another layer consisting of a second semiconductor of different conductivity type from that of the first semiconductor layer to form a flat surface, etching the whole surface of the second layer until the first semiconductor layer is exposed except at the area of the V-shaped zone, and forming ohmic electrodes on the V-shaped semiconductor zone, and on the first semiconductor layer on opposite sides of the V-shaped semiconductor zone, and on the back surface of a substrate for the laser.

The present invention will now be illustrated in more detail by one embodiment as shown in FIG. 2.

Figure 2A:
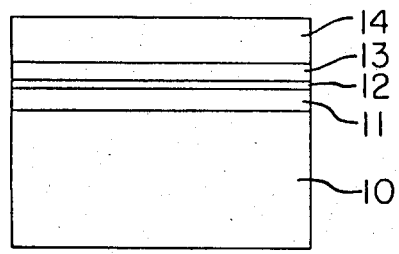
Figure 2D:
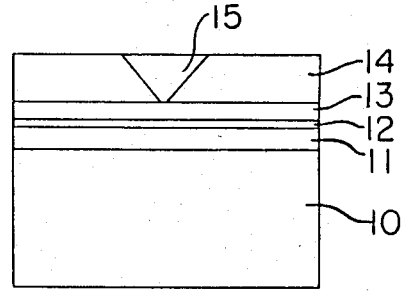
Figure 2B:
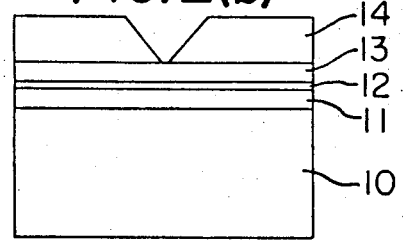
Figure 2E:
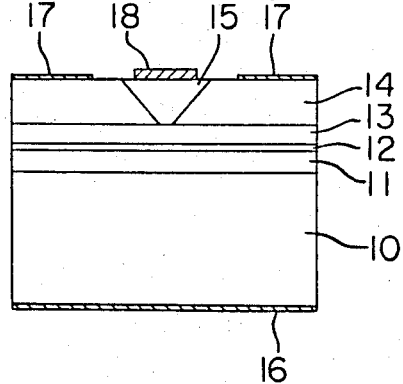
Figure 2C:
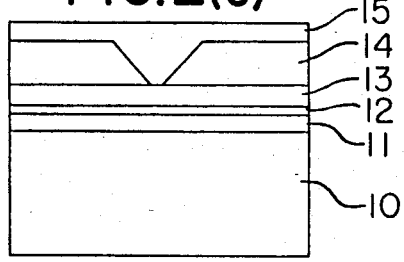

An epitaxial wafer having layers of n-type $Al_xGa_{1-x}As$ 11, p-type GaAs 12, p-type $Al_xGa_{1-x}As$ 13 and n-type GaAs 14 on a substrate on n-type GaAs 10 is subjected to etching with an etchant having a selectivity and anisotropy for GaAs, for example, a solution of $NH_3$, $H_2O_2$ and $H_2O$ (3:1:50), and n-type GaAs layer 14 is etched to form a V-shaped groove as shown in FIG. 2(b). During etching, the masking width should suitably be determined so that the width of the surface of p-type $Al_xGa_{1-x}As$ layer at the bottom of the V-shaped groove be a desired value. Then p-type GaAs 15 is grown by liquid phase epitaxy as shown in FIG. 2(c). It is found by our experiments that the surface of p-type GaAs layer 15 is made flat by growing it in a thickness somewhat larger than the thickness of n-type GaAs layer 14 in spite of the V-shaped groove in n-type GaAs layer 14. In the subsequent step, the surface of p-type GaAs layer 15 is etched until n-type GaAs layer 14 is exposed except on the area of the V-shaped zone as shown in FIG. 2(d). Finally, as shown in FIG. 2(e), there are formed ohmic electrode 16 of AuGeNi on the back surface of substrate 10, ohmic electrodes 17 of AuGeNi on n-type GaAs layer 14, and ohmic electrode 18 of AuCr on p-type GaAs zone 15.

In this embodiment, GaAs and GaAlAs are used, but in addition to these materials, InP, InGaAsP and any other materials of which semiconductor lasers can be made can of course be used in the present invention.

Furthermore, the structure of the semiconductor laser according to the present invention is not limited to the simple structure as described above.

The present invention has the following effects or advantages which cannot be obtained in the prior art:

(1) Since electric current flows through a narrow and long gate zone in an element with the structure according to the present invention, gain guiding is possible by concentration of electric current and a fundamental mode in the lateral direction is possible without using a complicated structure such as a stripe structure.

(2) Since the semiconductor device of the present invention has the structure of a vertical-type static induction transistor, large electric current can flow and a high speed operation is possible.

(3) Since the semiconductor device of the present invention has such a structure that a semiconductor laser and transistor are formed above and below in the same zone of a wafer, a process for the production thereof is simple.

(4) Since the semiconductor device of the present invention is readily made by forming a semiconductor laser and transistor for driving this laser on the same substrate, it is smaller than in the case of connecting the two elements prepared separately and is capable of realizing a high speed operation, high reliability and low production cost.

What is claimed is:

1. A process for making a semiconductor device, which comprises a step of growing epitaxially on the uppermost layer of a multilayer epitaxial wafer for composing a semiconductor laser a layer consisting of a semiconductor of different conductivity type from that of the uppermost layer, a step of etching the semiconductor layer only with anisotropic and selective etchant to give a cross section of V-type, a step of growing epitaxially another layer consisting of a semiconductor of different conductivity type from that of the semiconductor layer to form a flat surface, a step of etching the whole surface until the semiconductor layer is exposed except on the area of the V-type zone, and a step of forming ohmic electrodes on the semiconductor zone of V-type, the semiconductor layers positioned opposite each other across the semiconductor zone of V-type and the back surface of a substrate.

* * * * *